(12) United States Patent
Dougherty

(10) Patent No.: US 6,198,302 B1
(45) Date of Patent: Mar. 6, 2001

(54) SYSTEM AND METHOD FOR TESTING POWER SUPPLIES

(75) Inventor: James R. Dougherty, Mesquite, TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/054,182

(22) Filed: Apr. 2, 1998

(51) Int. Cl.⁷ ................................................. G01R 31/36
(52) U.S. Cl. ............................ 324/771; 324/426; 702/63
(58) Field of Search .................................... 324/771, 426; 323/312, 313, 275; 340/660–664

(56) References Cited

U.S. PATENT DOCUMENTS

| | | | | |
|---|---|---|---|---|
| 4,288,739 | * | 9/1981 | Nercessian | 323/275 |
| 4,899,269 | * | 2/1990 | Rouzies | 363/41 |
| 5,087,870 | * | 2/1992 | Selesky et al. | 323/276 |
| 5,397,999 | * | 3/1995 | Kanamaru | 324/771 |
| 5,483,165 | * | 1/1996 | Cameron et al. | 324/427 |
| 5,710,701 | * | 1/1998 | Brown | 364/185 |
| 5,905,439 | * | 5/1999 | McIntyre | 340/664 |

OTHER PUBLICATIONS

Carmichael et al., "Test Strategies for Power supplies", IEEE Conference Proceedings, Autotestcon '94, paper # 0–7803–1910–9/94, pp. 681–692, Sep. 1994.*

* cited by examiner

Primary Examiner—Safet Metjahic
Assistant Examiner—Anjan K Deb

(57) ABSTRACT

A control circuit, system for, and method of, testing a device under test (DUT) coupled to a load having a controllable load current level. The DUT is capable of operating in a regulated range and an unregulated range. In one embodiment, the control circuit includes: (1) minimum and maximum current control stages that set minimum and maximum load current values, respectively, for the control circuit and (2) an integrator, coupled to the DUT. In a constant current mode, the integrator selects one of the minimum and maximum load current values to control the load current level and test the DUT while the DUT is operating in the regulated range. In a constant voltage mode, the integrator produces an intermediate load current value based on a relationship between a voltage of an output of the DUT and a reference voltage to control the load current level and test the DUT while the DUT is operating in the unregulated range.

20 Claims, 3 Drawing Sheets

SYSTEM AND METHOD FOR TESTING POWER SUPPLIES

TECHNICAL FIELD OF THE INVENTION

The present invention is directed, in general, to testing apparatus and, more specifically, to a system and method for testing a power supply.

BACKGROUND OF THE INVENTION

Test systems requiring a constant voltage characteristic derived from multiple parallel-coupled loads are sometimes difficult to implement with commercially available loads. For instance, some systems allow only one load to operate in a constant voltage mode, while the remaining loads must be set to a constant current value. This particular implementation, however, limits the dynamic range of total load current because the loads set to the constant current value establish a minimum current for the system.

Other systems set one load in a constant voltage mode (e.g., a master) and drive additional loads (e.g., slaves) in a constant current mode with external control signals. This system, however, can only provide approximate current sharing among the loads. Still other systems provide a more uniform current sharing capability with the use of internal control mechanisms having the ability to convert from constant current control to constant voltage control. It is necessary with such systems to reset the loads during the transition from constant current control to constant voltage control. Resetting the loads from a constant current mode to a constant voltage mode, however, requires a great deal of time and effort that may be better served testing the device under test (DUT).

A typical application that employs commercial test loads for a DUT is with respect to the testing of power supplies and, in particular, a DC power supply (also, referred to as a DUT). A DC power supply, typically, has both a regulated voltage region and an unregulated voltage region where at higher currents the device goes into a current limit mode. The current limit mode is employed to protect the device from the possibly harmful effects of overloads. In the process of testing the DC power supply, it is generally desirable to employ constant current control for the loads when the DUT is in the regulated region and constant voltage control for the loads when the DUT is in the unregulated region.

Applying the aforementioned modes of control for the regulated and unregulated regions of the DUT can be better understood with reference to the voltage/current (V/I) curve of FIG. 3. Attempting to apply a constant voltage condition in the voltage regulated region, for example, makes it difficult (if not impossible in practical applications) to obtain a stable operating point on the curve. This is because the V/I curve of the DUT and the V/I curve of the load are nearly parallel with one another, and noise or drift may prevent a predictable operating condition. Conversely, attempting to establish a constant current condition in the unregulated region of the DUT (where the V/I curve of the DUT may exhibit a near constant current characteristic) also causes difficulties in achieving a stable operating point on the curve. Once again, this is because the V/I curves of the DUT and the load are nearly parallel to one another.

Another acceptable method of establishing stable load conditions in the unregulated region of the DC power supply is to provide constant resistance loads. Multiple constant resistance loads can be connected in parallel to exhibit a net combined parallel resistance.

Although the previously systems provide feasible alternatives for testing a DUT, there are several limitations associated with such systems. For instance, some test specifications may only allow constant voltage mode control as an acceptable method for testing the DUT. In such instances, a combination of current mode and voltage mode control is not available and in view of the foregoing discussion of testing a DC power supply that limitation is not acceptable. Additionally, limitations of some commercially available loads (e.g., some constant resistance loads) preclude the combined loads from achieving an output voltage near zero volts (i.e., a virtual short circuit). Thus, the DUT cannot be tested over its full range as is necessary with many DUTs such as DC power supplies.

Accordingly, what is needed in the art is a system for testing a DUT capable of operating in a regulated region and an unregulated region that allows transitioning between constant current conditions and constant voltage conditions.

SUMMARY OF THE INVENTION

To address the above-discussed deficiencies of the prior art, the present invention provides a control circuit and system for, and method of, testing a device under test (DUT) capable of operating in a regulated range and an unregulated range, the DUT coupled to a load having a controllable load current level. In one embodiment, the control circuit includes: (1) minimum and maximum current control stages that set minimum and maximum load current values, respectively, for the control circuit and (2) an integrator, coupled to the DUT, that: (2a) in a constant current mode, selects one of the minimum and maximum load current values to control the load current level and test the DUT while operating in the regulated range and (2b) in a constant voltage mode, produces an intermediate load current value based on a relationship between a voltage of an output of the DUT and a reference voltage to control the load current level and test the DUT while operating in the unregulated range.

The present invention therefore introduces the broad concept of testing a DUT over both its regulated and unregulated ranges with a single load, such that separate loads for each range are not required. In an embodiment to be illustrated and described, the present invention employs both minimum and maximum current control stages to realize dual-range testing.

In one embodiment of the present invention, the DUT is coupled to a plurality of loads in parallel, each of the plurality of loads having controllable load current levels, the control circuit controlling each of the load current levels to test the DUT. Of course, a single load can be employed in lieu of multiple loads.

In one embodiment of the present invention, at least one of the minimum and maximum current control stages has a control input to render selectable at least one of the minimum and maximum load current values, respectively. In an embodiment to be illustrated and described, a digital number (perhaps from a controlling computer) can be supplied to one or both control inputs to effect value selectivity.

In one embodiment of the present invention, in the constant current mode, the reference voltage is established at a value greater than a regulated output voltage of the DUT, the minimum load current value is established at a desired constant current value and the maximum load current value is established at a desired maximum current value exceeding the desired constant current value to cause the minimum current control stage to control the load current level and test the DUT while operating in the regulated range.

In a related embodiment, in the constant current mode, the reference voltage is established at a value less than a regulated output voltage of the DUT, the maximum load current value is established at a desired constant current value to cause the maximum current control stage to control the load current level and test the DUT while operating in the regulated range.

In another related embodiment, in the constant voltage mode, the reference voltage is established at a desired constant output voltage less than a regulated output voltage of the DUT, the minimum load current value is established at a desired minimum current value and the maximum load current value is established at a maximum current compliance value in a relevant testing range within the unregulated range. Those skilled in the art may perceive that the reference voltage and minimum and maximum load current values can be manipulated relative to one another to achieve other testing objectives.

In one embodiment of the present invention, the DUT is a DC power supply. Those skilled in the art will see, however, that the present invention is equally advantageous in testing other circuitry capable of providing a regulated output.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
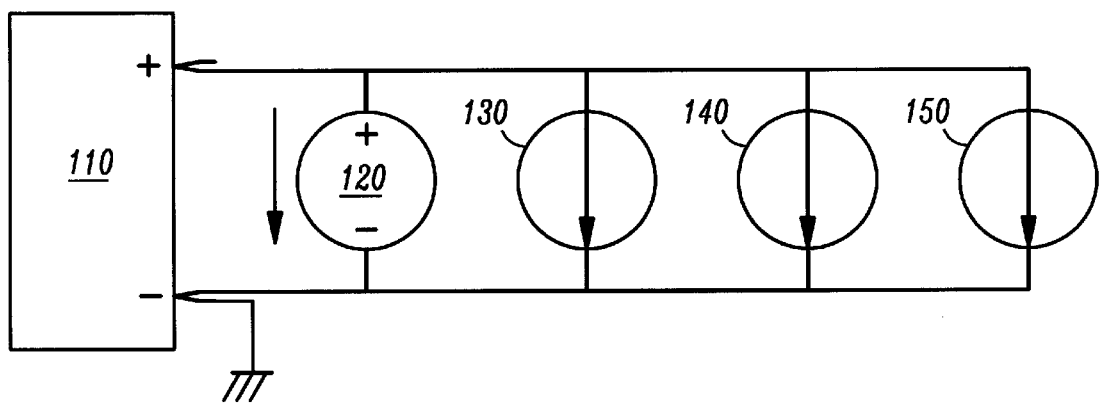
FIG. 1 illustrates a block diagram of a prior art test circuit for testing a device under test (DUT)

Referring initially to FIG. 1, illustrated is a block diagram of a prior art test circuit for testing a device under test (DUT) 110. The test circuit for testing the DUT 110 (e.g., a DUT having a DC voltage output) includes first, second, third and fourth loads 120, 130, 140, 150 coupled in parallel to the DUT 110. The first load 120 operates in a constant voltage mode while the second, third and fourth loads 130, 140, 150 operate in constant current modes. Those skilled in the art understand that more or less constant current loads can be employed in the test circuit.

The first load 120 is the constant voltage load that establishes the value of constant voltage across the DUT 110. The remaining loads 130, 140, 150 provide additional current capability that is not otherwise provided by the current compliance of the first load 120. The additional constant current loads 130, 140, 150 are required when the DUT 110 demands more current than is provided by the single constant voltage load 120. As previously mentioned, this configuration cannot be employed in many applications due to the limitations associated with the dynamic range of total load current. More specifically, the fixed current loads 130, 140, 150 establish a minimum current and the DUT 110 cannot be tested below that particular threshold.

Figure 2:
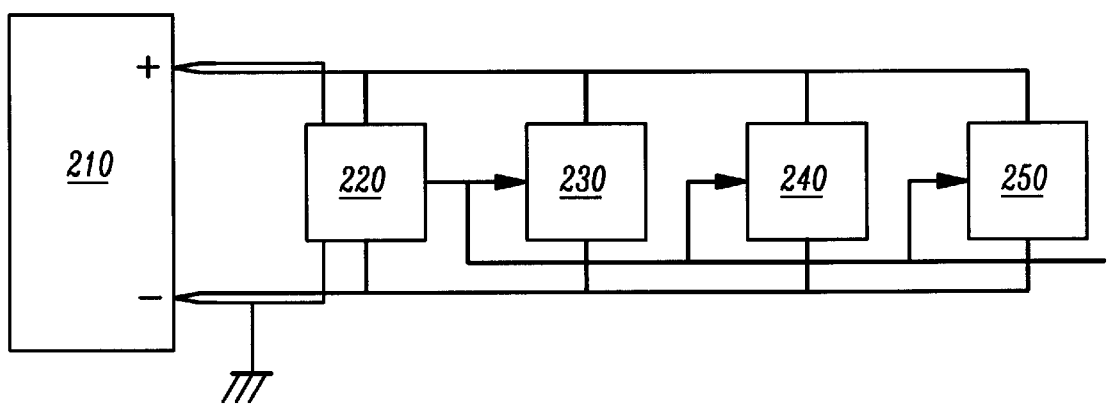
FIG. 2 illustrates a block diagram of another prior art test circuit for testing a device under test (DUT)

Turning now to FIG. 2, illustrated is a block diagram of another prior art test circuit for testing a device under test (DUT). The test circuit for testing the DUT 210 (e.g., a DUT having a DC voltage output) includes first, second, third and fourth loads 220, 230, 240, 250 coupled in parallel to the DUT 110. The first load 220 operates in a constant voltage mode and the remaining loads 230, 240, 250 operate in constant current modes. The first load 220 functions as a master load that drives the fixed current loads 230, 240, 250 as slaves by way of externally connected control signals to provide approximate current sharing among the second, third and fourth loads 230, 240 and 250.

The drive signal of the first load 220 is a scaled voltage that is proportional to the current through the first load 220. This drive signal feeds inputs to the third, fourth and fifth loads 230, 240, 250 that causes them to set constant current values proportional to the drive signal. As a result of the operation of this configuration, however, only approximate current sharing can be achieved among the loads.

Figure 3:
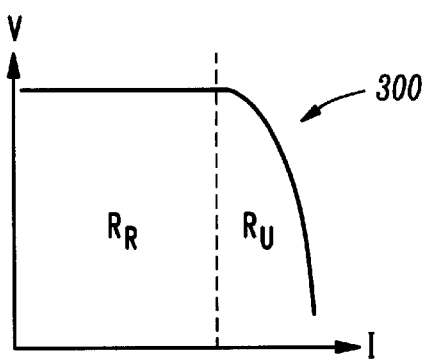
FIG. 3 illustrates a voltage/current (V/I) curve for an embodiment of a DUT employable with the system of the present invention.

Turning now to FIG. 3, illustrated is a voltage/current (V/I) curve 300 for an embodiment of DUT employable with the system of the present invention. The representative DUT exhibits both a regulated region (represented by region $R_R$) and an unregulated region (represented by region $R_U$). In the regulated region $R_R$ the output voltage of the DUT is relatively constant and in the unregulated region $R_U$, at higher currents, the DUT operates in a current limit mode.

Typically, constant current mode of control is employed when testing the regulated region $R_R$ of the DUT and constant voltage mode of control is employed when testing the unregulated region $R_U$ of the DUT. A constant current load is more suitable for the regulated region $R_R$ and a constant voltage load is more suitable for the unregulated (overload) region $R_U$ because of the way the load and DUT curves intersect. Obtaining a stable operating point in the regulated region $R_R$ while applying constant voltage control is very difficult (if not impossible) since the V/I curve 300 of the DUT and the V/I curve of the load (not shown) are nearly parallel and noise or drift prevents a predictable operating condition. Similarly, employing constant current control in the unregulated region $R_U$ causes difficulty in establishing stable operating points since the V/I curve 300 of the DUT exhibits a near constant current characteristic.

Figure 4:
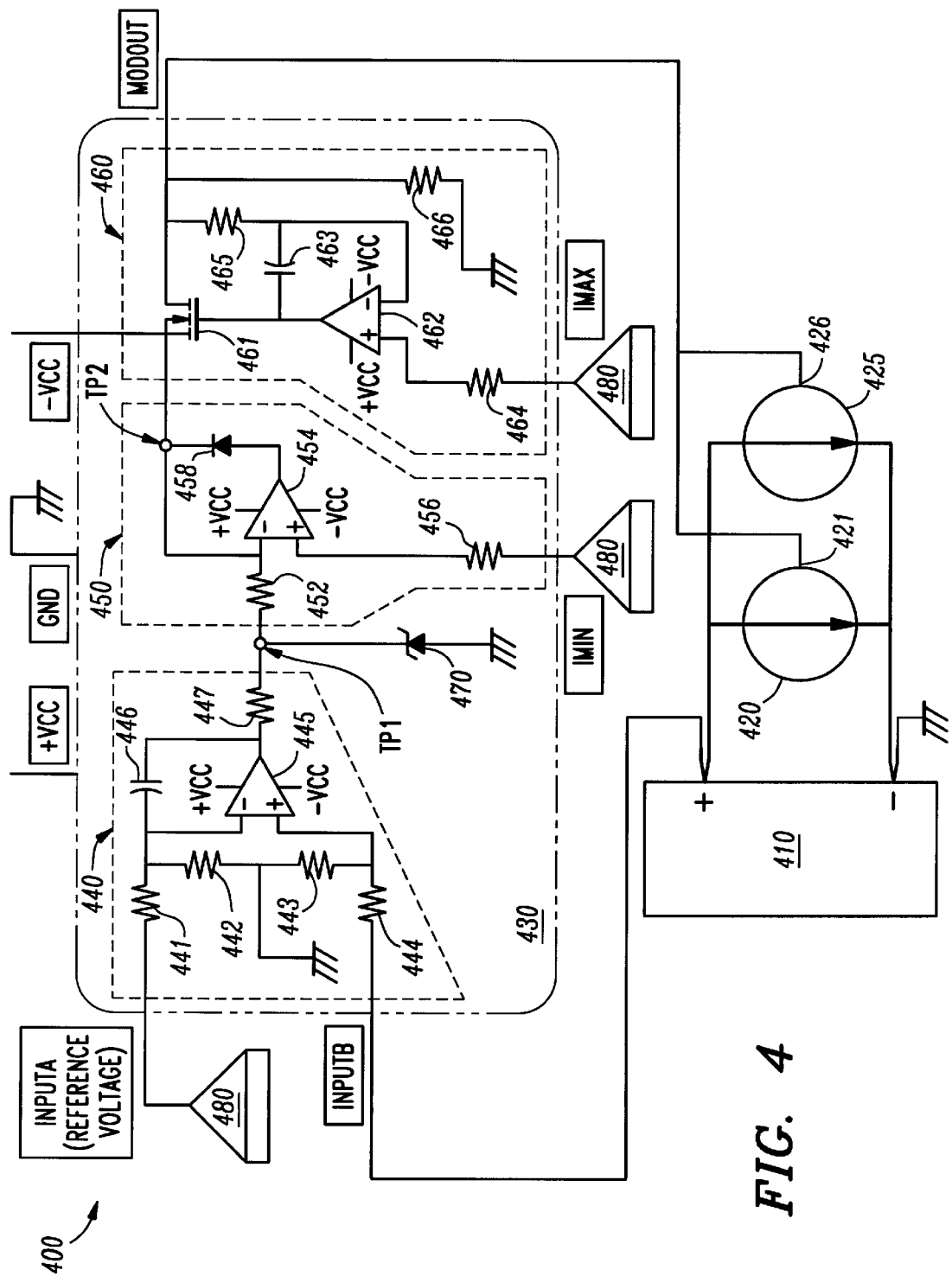
FIG. 4 illustrates a schematic diagram of an embodiment of a system for testing a DUT constructed according to the principles of the present invention.

Turning now to FIG. 4, illustrated is a schematic diagram of an embodiment of a system 400 for testing a DUT 410 constructed according to the principles of the present invention. The system 400 coupled to the DUT 410 (e.g., a power supply having a DC voltage output) includes first and second parallel-coupled loads 420, 425 having modulation inputs 421, 426, respectively, for controlling current output values for the first and second loads 420, 425. Additionally, the system 400 includes a control circuit 430 capable of transforming multiple constant current loads connected in parallel into a combined precision constant voltage load. The constant current loads may thus provide a constant voltage to the DUT 410 while maintaining close current sharing among the loads (e.g., the first and second loads 420, 425). While the present embodiment illustrates two loads, the system of the present invention is equally employable with one load or more than two loads.

The control circuit 430 includes three stages, namely, an integrator stage 440, a minimum current control stage 450 and a maximum current control stage 460. The minimum current control stage 450 and the maximum current control stage 460 set minimum and maximum load current values, respectively, for the control circuit 430. The integrator stage 440 operates in either a constant current mode or in a constant voltage mode. During the constant current mode, the integrator stage 440 selects one of the minimum or maximum load current values to control the load current when the DUTs 410 is operating in the regulated voltage range. Alternately, in a constant voltage mode, the integrator stage 440 produces a load current value based upon the relationship between voltage of the DUT 410 and a reference voltage to control the load current value when the DUTs 410 is operating in the unregulated voltage range.

The integrator stage 440 includes a first resistor 441 coupled between an inverting input of a first operational amplifier (op-amp) 445 and a first input INPUTA (reference voltage). The first op-amp 445 is powered and limited by a positive and negative supplied voltage +Vcc, −Vcc (usually 15V and −15V, respectively). A second resistor 442 is coupled to an inverting input of the first op-amp 445 and is subsequently coupled to a third resistor 443 which is, in turn, coupled to the noninverting input of the first op-amp 445. A fourth resistor 444 is further coupled between the noninverting input of the first op-amp 445 and a second input INPUTB. A first capacitor 446 is coupled between the inverting input and the output of the first op-amp 445. Finally, a fifth resistor 447 is coupled between the output of the first op-amp 445 and the minimum current control stage 450. A zener diode 470 is coupled between the fifth resistor 447 and ground.

The minimum current control stage 450 includes a sixth resistor 452 that is coupled between the fifth resistor 447 and the inverting input of a second op-amp 454. The second op-amp 454 is powered and limited by a positive and negative supplied voltage +Vcc, −Vcc. A fist measurement node TP1 is located between the fifth resistor 447 and the sixth resistor 452. A seventh resistor 456 is coupled between the noninverting input of the second op-amp and a third input IMIN. Lastly, a diode 458 is coupled between the output of the second op-amp and the maximum current control stage 460. A second measurement node TP2 is located between the diode 458 and the inverting input of the second op-amp 454.

The maximum current control stage 460 includes a field effect transistor (FET) 461 that is coupled to the diode 458 and the inverting input of the second op-amp 454. Additionally, the FET 461 is coupled to the output of a third op-amp 462 and is further coupled to a control circuit output or output signal MODOUT. The third op-amp 462 is powered and limited by a positive and negative supplied voltage +Vcc, −Vcc. A second capacitor 463 is coupled between the output and the inverting input of the third op-amp 462. An eighth resistor 464 is coupled between the noninverting input of the third op-amp 462 and the fourth input IMAX. A ninth resistor 465 is coupled between the inverting input of the third op-amp 462 and the output signal MODOUT. Finally, a tenth resistor 466 is coupled between the output signal MODOUT and ground.

The minimum current control stage 450 maintains a selected minimum voltage at the second measurement node TP2 when the voltage value at the second measurement node TP2 drops to the selected minimum voltage value set by the third input IMIN. When the voltage at the first measurement node TP1 is less than the selected voltage at the third input IMIN, the diode 458 is forward biased and the voltages at the inverting and non-inverting inputs of the second op-amp 454 are identical. As a result, the second op-amp 454 behaves as a typical voltage follower and the voltage at the second measurement node TP2 follows the voltage set at the fourth input IMAX.

When the voltage at the first measurement node TP1 is greater than the voltage at the fourth input IMAX, the voltage at second measurement node TP2 follows the voltage at the first measurement node TP1. In such a case, the diode 458 is reversed biased and the output of the second op-amp 454 is subsequently blocked by the diode 458 and does not affect the voltage at the second measurement node TP2. The voltage at the first measurement node TP1 is therefore applied to the second measurement node TP2, as long as the tenth resistor 466 is much greater than the sixth resistor 452. By way of example, in a preferred embodiment, the value of the tenth resistor 466 is about 10 KΩ while the value of the sixth resistor is about 1 KΩ. In this manner, the voltage at the third input IMIN establishes a minimum load current value because the load current is proportional to the output signal MODOUT and the voltage at the second measurement node TP2 when the FET 461 is active.

The maximum current control stage 460 establishes a maximum load current value. If the output signal MODOUT attempts to rise above the fourth input IMAX, the inverting input of the third op-amp 462, through the ninth resistor 465, causes the output of the third op-amp 462 to provide a less positive gate drive to the FET 461. This, in turn, causes the drain-to-source resistance in the FET 461 to increase to limit the voltage at the output MODOUT to the selected voltage value set at the fourth input IMAX. Conversely, if the voltage at the output MODOUT is below the selected voltage at the fourth input IMAX, the third op-amp 462 produces an output voltage that completely turns on FET 461. In such a case, the voltage at the output MODOUT follows the voltage at the second measurement node TP2. In this manner, the load current value is limited to a maximum value proportional to the voltage set at the fourth input IMAX.

The positive output of the DUT 410 is coupled to the control circuit 430 at the second input INPUTB. Further, the control circuit 430 is coupled to the modulation inputs 421, 426 of each of the loads 420, 425 from the output signal MODOUT. Also, a digital/analog converter (DAC) 480 is coupled to the first, third and fourth inputs INPUTA, IMIN, IMAX to provide preselected input voltages. Those skilled in the art recognize that general adjustable voltage sources may be substituted in place of the DAC 480. It should further be noted that the connection between the DUT 410, the loads 420, 425 and the control circuit 430 are configured for a positive DUT output power supply. For a negative DUT output voltage, the connections to the first and second inputs INPUTA, INPUTB should be reversed.

The DUT positive output is connected to the second input INPUTB and the output signal MODOUT drives the modulation inputs 421, 426, of the current loads 420, 425. The voltage range of the output signal MODOUT that drives the current loads 420, 425 is commonly 0V to 10V to be compatible with commercially available loads. The full-scale current range of the combined current loads 420, 425 is therefore equivalent to 10V at the output signal MODOUT. The user programs the DAC 480 at the first input INPUTA to set the constant voltage value. The voltage at the third input IMIN sets a minimum load current value and the voltage at the fourth input IMAX sets a maximum load current value. The scaling of voltage to current at both the third and fourth inputs IMIN, IMAX is identical to the output signal MODOUT, namely 10V for full-scale current loading of the combined loads.

The first, second, third and fourth resistors 441, 442, 443, 444 form a voltage divider for attenuation at the inputs of the first op-amp 445. This allows for approximately 60V of DUT 410 output voltage control when biasing the op-amps +/−15V VCC.

Turning now to FIGS. 5A–5D, illustrated are exemplary voltage/current (V/I) curves showing various system parameters during modes of operation for the system 400 of FIG. 4. The control circuit 430 essentially operates in three different modes depending on the settings of the DAC 480 at the first, third and fourth inputs INPUTA, IMIN, IMAX.

Figure 5A:
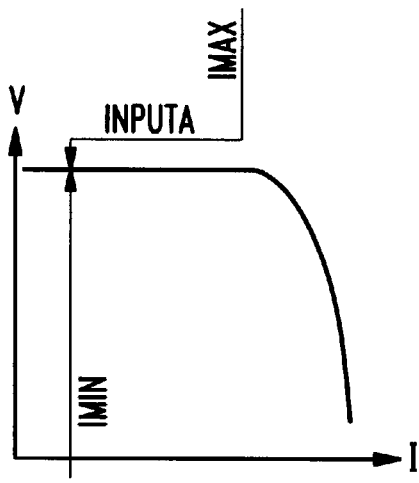
FIGS. 5A–5D illustrate exemplary voltage/current (V/I) curves showing various system parameters during modes of operation for the system of FIG. 4.

FIG. 5A shows the operation of the control circuit 430 during a constant current mode controlled by the third input IMIN. The first input INPUTA is set to a voltage greater than the regulated voltage of the DUT 410. When the output of the first op-amp 445 is at −Vcc, the zener diode 470 is forward biased and the voltage at the measurement node TP2 follows the voltage at the third input IMIN. The voltage at the third input IMIN is set to a voltage that corresponds to the desired constant current value. The voltage at the fourth input IMAX is set to a voltage that corresponds to the desired maximum current value greater that at the third input IMIN. As long as the value at the third input IMIN is below the fourth input IMAX, the voltage at the output signal MODOUT will follow the voltage at the third input IMIN. The output current of the DUT 410 is therefore controlled by the third input IMIN. This mode of operation is advantageous in establishing a minimum load current condition for cases when commercial loads or DUTs require minimum load currents for safe operation. When a minimum load condition is not necessary, the third input IMIN voltage can be set to 0V or connected to ground.

Figure 5B:
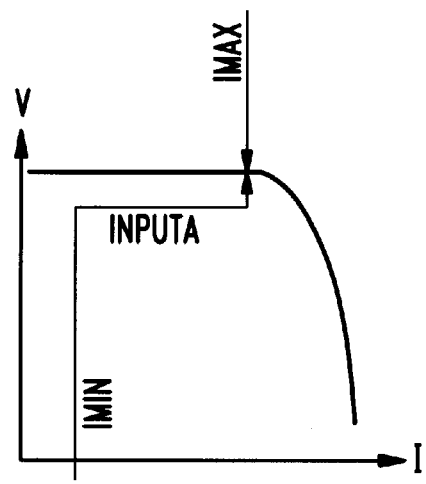

FIG. 5B shows the control circuit 430 operation during a constant current mode controlled by the fourth IMAX. During this mode of operation, the first input INPUTA is set to a voltage less than the regulated output voltage of the DUT 410 and the voltage at the third input IMIN is set to a voltage that corresponds to a current below the desired minimum constant current value. The voltage at the fourth input IMAX is set to a voltage that corresponds to the desired constant current value. As long as the output voltage of the DUT 410 is greater than first input INPUTA voltage, the control circuit output signal MODOUT will follow the fourth input IMAX and therefore the output current of the DUT 410 is controlled by the fourth input IMAX voltage.

In this mode, the third op-amp 462 provides feedback to increase the FET's 461 drain-to-source resistance just enough to limit the voltage at the output signal MODOUT to the voltage set by the fourth input IMAX. Further, this operational mode is advantageous in characterizing the voltage/current behavior of the DUT 410 just after it enters the unregulated region. As the voltage at the fourth input IMAX increases to provide increasing load currents, feedback control of the first op-amp 445 ensures that the output voltage of the DUT 410 never drops below the voltage at the first input INPUTA.

The value at the fourth input IMAX can be incremented at an arbitrarily slow rate to ensure a smooth transition from regulated to unregulated region of the DUT 410. This allows the first op-amp 445 to take control of load current from the fourth input IMAX when the first op-amp 445 is safely operating as an integrator in its active region. The voltage programmed at the first input INPUTA establishes constant voltage points in the unregulated region once the voltage at the fourth input IMAX is greater than the output current of the DUT 410 necessary to sustain the specified voltage.

Figure 5C:
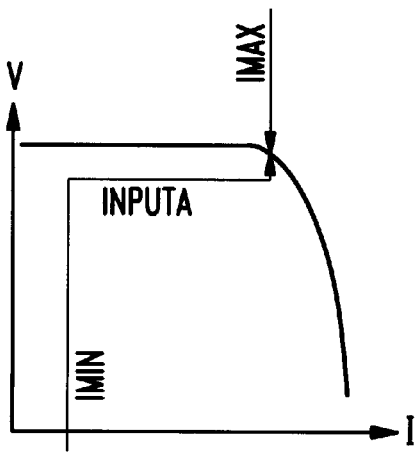

FIG. 5C shows the control circuit 430 operation at a load intersection when the DUT 410 is smoothly transitioning from constant current to constant voltage mode. Alternatively, this figure can be described as illustrating when the DUT transitions from its regulated output to its unregulated output.

Figure 5D:
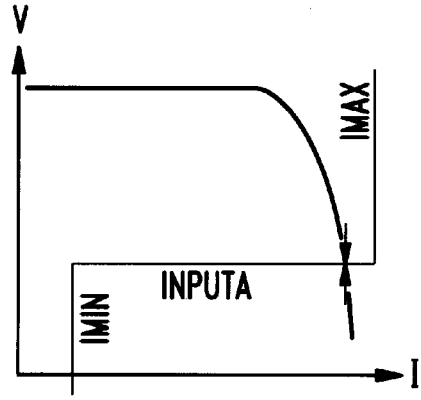

Finally, FIG. 5D shows the control circuit 430 operation during a constant voltage mode controlled by the first input INPUTA. The voltage at the first input INPUTA is set to the desired constant output voltage below the DUT 410 regulated output voltage. The voltage at the third input IMIN is set to a voltage that corresponds to the desired minimum current setting. The fourth input IMAX is set to a voltage that corresponds to a maximum current compliance of the controlled output voltage for all points of interest in the unregulated region. As long as the DUT 410 output current is less than the current set by the fourth input IMAX, the DUT 410 output voltage is controlled by the first input INPUTA.

The first input INPUTA can be continually adjusted to establish various constant output voltages in the unregulated region. The response of the voltage control depends on the integration time constant of the combination of the first and second resistors 441, 442 in parallel and the first capacitor 446, as well as the dynamic characteristics of the current load and the DUT 410. A user can select a value for the first capacitor 446 to obtain the desired dynamic characteristics in light of the overall feedback path characteristics.

In summary, while operating in a constant voltage mode, the integrator, through feedback control, applies an intermediate load current, by way of the output MODOUT, to maintain the current required by the DUT V/I curve at the voltages set at the first input INPUTA. Thus, based on the relationship between DUT output voltage (i.e., the DUT V/I curve) and a reference voltage to control the load current level (i.e., first input, INPUTA) the DUT is tested while operating in the unregulated range.

Thus, the present invention provides a system for testing a DUT over both its regulated and unregulated ranges with a single load, such that separate loads for each range are not required. While the preceding FIGUREs illustrate a specific embodiment of the present invention, it should be clear that variations and other circuits capable of testing a DUT over both its regulated and unregulated ranges are well within the broad scope of the present invention. Additionally, the present invention may be embodied as a sequence of instructions executable in a general purpose computer system, in dedicated or hardwired discrete or integrated circuitry, or any combinations thereof.

For a better understanding of computer systems that may used with the present invention and power supplies that may be used as a DUT see the references listed below of which are incorporated herein by reference. Conventional computer systems architecture are more fully discussed in *The Indispensable PC Hardware Book,* by Hans-Peter Messmer, Addison Wesley (2nd ed. 1995) and *Computer Organization and Architecture,* by William Stallings, MacMillan Publishing Co. (3rd ed. 1993). Power electronics and power supplies, such as DC power supplies, are more fully discussed in *Principles of Power Electronics,* by Kassakian, et al., Addison-Wesley Publishing Company (1991).

Although the present invention has been described in detail, those skilled in the art should understand that they can make various changes, substitutions and alterations herein without departing from the spirit and scope of the invention in its broadest form.

What is claimed is:

1. A control circuit for testing a device under test (DUT) capable of operating in a regulated range and an unregulated range, said DUT coupled to a load having a controllable load current level, comprising:
    minimum and maximum current control stages that set minimum and maximum load current values, respectively, for said control circuit; and
    an integrator, coupled to said DUT, that:
        in a constant current mode, selects one of said minimum and maximum load current values to control said load current level and test said DUT while said DUT is operating in said regulated range, and
        in a constant voltage mode, produces an intermediate load current value based on a relationship between a voltage of an output of said DUT and a reference voltage to control said load current level and test said DUT while said DUT is operating in said unregulated range, said control circuit capable of transitioning said load smoothly between said constant current mode and said constant voltage mode.

2. The control circuit as recited in claim 1 wherein said DUT is coupled to a plurality of loads in parallel, each of said plurality of loads having controllable load current levels, said control circuit controlling each of said load current levels to test said DUT.

3. The control circuit as recited in claim 1 wherein at least one of said minimum and maximum current control stages has a control input to render selectable at least one of said minimum and maximum load current values, respectively.

4. The control circuit as recited in claim 1 wherein, in said constant current mode, said reference voltage is established at a value greater than a regulated output voltage of said DUT, said minimum load current value is established at a desired constant current value and said maximum load current value is established at a desired maximum current value exceeding said desired constant current value to cause said minimum current control stage to control said load current level and test said DUT while said DUT is operating in said regulated range.

5. The control circuit as recited in claim 1 wherein, in said constant current mode, said reference voltage is established at a value less than a regulated output voltage of said DUT, said maximum load current value is established at a desired constant current value to cause said maximum current control stage to control said load current level and test said DUT while said DUT is operating in said regulated range.

6. The control circuit as recited in claim 1 wherein, in said constant voltage mode, said reference voltage is established at a desired constant output voltage less than a regulated output voltage of said DUT, said minimum load current value is established at a desired minimum current value and said maximum load current value is established at a maximum current compliance value in a relevant testing range within said unregulated range.

7. The control circuit as recited in claim 1 wherein said DUT is a DC power supply.

8. A method of testing a device under test (DUT) capable of operating in a regulated range and an unregulated range, said DUT coupled to a load having a controllable load current level, comprising:
    setting minimum and maximum load current values for a control circuit;
    energizing said control circuit and said DUT; and
    smoothly transitioning said load between:
        a constant current mode in which one of said minimum and maximum load current values controls said load current level to test said DUT while said DUT is operating in said regulated range, and
        a constant voltage mode in which an intermediate load current value based on a relationship between a voltage of an output of said DUT and a reference voltage controls said load current level to test said DUT while said DUT is operating in said unregulated range.

9. The method as recited in claim 8 wherein said DUT is coupled to a plurality of loads in parallel, each of said plurality of loads having controllable load current levels, said transitioning comprises controlling each of said load current levels to test said DUT.

10. The method as recited in claim 8 wherein said setting comprises providing a value to a control input of at least one of minimum and maximum current control stages.

11. The method as recited in claim 8 further comprising:
    establishing said reference voltage at a value greater than a regulated output voltage of said DUT;
    establishing said minimum load current value at a desired constant current value;
    establishing said maximum load current value at a desired maximum current value exceeding said desired constant current value; and
    testing said DUT while said DUT is operating in said regulated range.

12. The method as recited in claim 8 further comprising:
    establishing said reference voltage at a value less than a regulated output voltage of said DUT;
    establishing said maximum load current value at a desired constant current value; and
    testing said DUT while said DUT is operating in said regulated range.

13. The method as recited in claim 8 further comprising:
    establishing said reference voltage at a desired constant output voltage less than a regulated output voltage of said DUT;
    establishing said minimum load current value at a desired minimum current value;
    establishing said maximum load current value at a maximum current compliance value in a relevant testing range within said unregulated range; and
    testing said DUT while said DUT is operating in said unregulated range.

14. The method as recited in claim 8 wherein said DUT is a DC power supply.

15. A system for testing a device under test (DUT) capable of operating in a regulated range and an unregulated range, comprising:
    at least one load, couplable to said DUT and having controllable load current levels;
    minimum and maximum current control stages, couplable to control inputs on said at least one load, that set minimum and maximum load current values, respectively, for said system; and
    an integrator, coupled to said DUT and said control inputs, that:

in a constant current mode, selects one of said minimum and maximum load current values to control said load current levels and test said DUT while said DUT is operating in said regulated range, and in a constant voltage mode, produces an intermediate load current value based on a relationship between a voltage of an output of said DUT and a reference voltage to control said load current levels and test said DUT while said DUT is operating in said unregulated range, said system capable of transitioning said load smoothly between said constant current mode and said constant voltage mode.

16. The system as recited in claim 15 wherein at least one of said minimum and maximum current control stages has a control input to render selectable at least one of said minimum and maximum load current values, respectively.

17. The system as recited in claim 15 wherein, in said constant current mode, said reference voltage is established at a value greater than a regulated output voltage of said DUT, said minimum load current value is established at a desired constant current value and said maximum load current value is established at a desired maximum current value exceeding said desired constant current value to cause said minimum current control stage to control said load current level and test said DUT while said DUT is operating in said regulated range.

18. The system as recited in claim 15 wherein, in said constant current mode, said reference voltage is established at a value less than a regulated output voltage of said DUT, said maximum load current value is established at a desired constant current value to cause said maximum current control stage to control said load current level and test said DUT while said DUT is operating in said regulated range.

19. The system as recited in claim 15 wherein, in said constant voltage mode, said reference voltage is established at a desired constant output voltage less than a regulated output voltage of said DUT, said minimum load current value is established at a desired minimum current value and said maximum load current value is established at a maximum current compliance value in a relevant testing range within said unregulated range.

20. The system as recited in claim 15 wherein said DUT is a DC power supply.

\* \* \* \* \*